United States Patent
Lee

(10) Patent No.: US 10,665,291 B2
(45) Date of Patent: May 26, 2020

(54) MEMORY DEVICE AND OPERATING METHOD THEREOF

(71) Applicant: SK hynix Inc., Gyeonggi-do (KR)

(72) Inventor: Hee Youl Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/189,702

(22) Filed: Nov. 13, 2018

(65) Prior Publication Data
US 2019/0325938 A1 Oct. 24, 2019

(30) Foreign Application Priority Data
Apr. 19, 2018 (KR) .................. 10-2018-0045725

(51) Int. Cl.
G11C 11/408 (2006.01)
G11C 11/4074 (2006.01)
H03K 19/1776 (2020.01)

(52) U.S. Cl.
CPC ...... G11C 11/4085 (2013.01); G11C 11/4074 (2013.01); H03K 19/1776 (2013.01)

(58) Field of Classification Search
CPC ............ G11C 11/4085; G11C 11/4074; H03K 19/1776
USPC ................................................... 365/185.23
See application file for complete search history.

(56) References Cited

U.S. PATENT DOCUMENTS

2010/0329005 A1* 12/2010 Yang .................. G11C 11/5628
365/185.03

FOREIGN PATENT DOCUMENTS

KR    1020090025537    3/2009
KR    1020110001577    1/2011

* cited by examiner

*Primary Examiner* — Fernando Hidalgo
(74) *Attorney, Agent, or Firm* — IP & T Group LLP

(57) ABSTRACT

A memory device includes: a memory cell array including a plurality of memory cells respectively coupled to a plurality of word lines; a peripheral circuit configured to perform at least one program loop including applying a program voltage to selected memory cells coupled to a selected word line among the plurality of word lines and determining whether the selected memory cells have been completely programmed; and control logic configured to control the peripheral circuit to, while the program voltage is being applied to the selected word line, apply program control voltages of different levels to bit lines respectively coupled to memory cells in a first memory cell group among the selected memory cells and apply a program allowable voltage to bit lines respectively coupled to memory cells in a second memory cell group among the selected memory cells.

19 Claims, 14 Drawing Sheets

MEMORY DEVICE AND OPERATING METHOD THEREOF

CROSS-REFERENCE TO RELATED APPLICATION

The present application claims priority under 35 U.S.C. § 119(a) to Korean patent application number 10-2018-0045725, filed on Apr. 19, 2018, the entire disclosure of which is incorporated herein by reference in its entirety.

BACKGROUND

1. Field of Invention

Various embodiments of the present disclosure generally relate to an electronic device. Particularly, the embodiments relate to a memory device and an operating method thereof.

2. Description of Related Art

A memory device may be classified as a volatile memory or a nonvolatile memory. The nonvolatile memory includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

Embodiments provide a memory device having an improved program operation speed and an operating method of the memory device.

According to an aspect of the present disclosure, there is provided a memory device including: a memory cell array including a plurality of memory cells respectively coupled to a plurality of word lines; a peripheral circuit configured to perform at least one program loop including applying a program voltage to selected memory cells coupled to a selected word line among the plurality of word lines and determining whether the selected memory cells have been completely programmed; and control logic configured to control the peripheral circuit to, while the program voltage is being applied to the selected word line, apply program control voltages of different levels to bit lines respectively coupled to memory cells in a first memory cell group among the selected memory cells and apply a program allowable voltage to bit lines respectively coupled to memory cells in a second memory cell group among the selected memory cells.

According to another aspect of the present disclosure, there is provided a method for operating a memory device including a plurality of memory cells respectively coupled to a plurality of word lines, the method including: performing at least one program loop including applying a program voltage to selected memory cells coupled to a selected word line among the plurality of word lines and determining whether the selected memory cells have been completely programmed; and while the program voltage is being applied to the selected word line, applying program control voltages of different levels to bit lines respectively coupled to memory cells in a first memory cell group among the selected memory cells and applying a program allowable voltage to bit lines respectively coupled to memory cells in a second memory cell group among the selected memory cells.

According to another aspect of the present disclosure, there is provided a memory device including: a plurality of memory cells coupled to a word line; a peripheral circuit configured to perform a shadow program operation or a normal program operation on the plurality of memory cells; and control logic configured to control the peripheral circuit to perform the shadow program operation on some memory cells among the plurality of memory cells and perform the normal program operation on the other memory cells among the plurality of memory cells, wherein the normal program operation is configured to program memory cells to be in, as a target program state, a program state corresponding to a program voltage applied to the word line, and the shadow program operation is configured to simultaneously program memory cells to be in, as a target program state, a program state corresponding to the program voltage applied to the word line and program memory cells to be in, as a target program state, a program state different from that corresponding to the program voltage.

According to another aspect of the present disclosure, there is provided a memory device including: first and second groups of memory cells coupled to a selected word line; and a program circuit configured to: program the first group to be in corresponding target program states by applying program voltages to the selected word line; and simultaneously program, in the second group, a memory cell to be in a first target program state by applying the program voltages and remaining memory cells to be in corresponding target program states different from the first target program state.

BRIEF DESCRIPTION OF THE DRAWINGS

Various embodiments will now be described more fully with reference to the accompanying drawings; however, elements and features of the present disclosure may be configured or arranged differently than shown or described herein. Thus, the present invention is not limited to the embodiments set forth herein. Rather, these embodiments are provided so that this disclosure is thorough and complete and fully conveys the scope of the embodiments to those skilled in the art.

In the drawings, dimensions of the figures may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
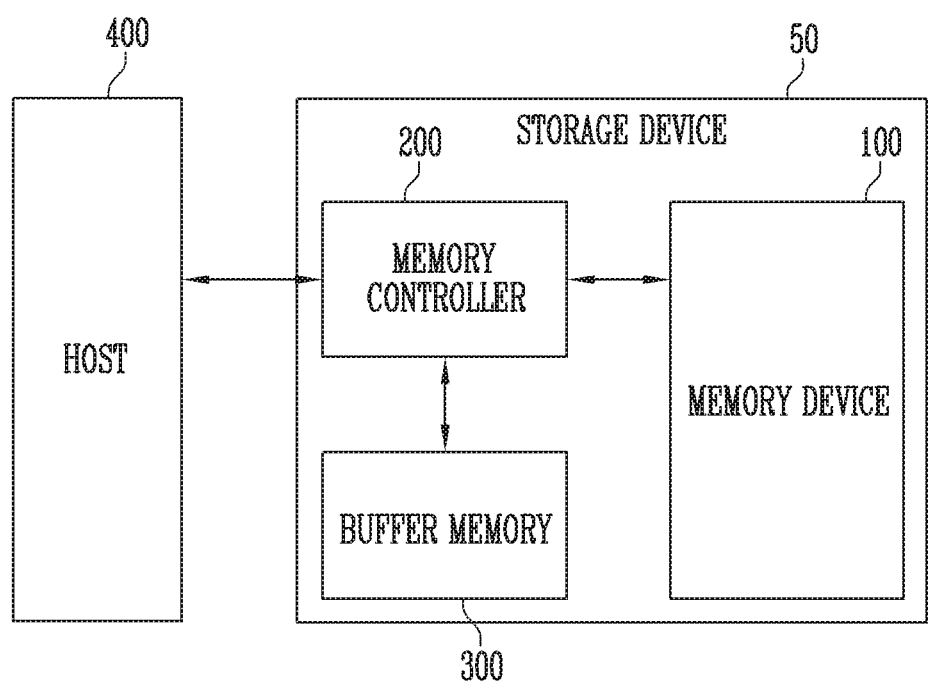
FIG. 1 is a block diagram illustrating a storage device according to an embodiment of the present disclosure.

The specific structural or functional description herein is merely for the purpose of describing embodiments of the present disclosure. However, embodiments can be modified in various ways or implemented in various forms, and thus the present invention is not to be construed as limited to the embodiments set forth herein. Rather, the present invention encompasses changes, modifications, equivalents, and/or substitutes that do not depart from the spirit and technical scope of the present disclosure.

Moreover, throughout the specification, reference to "an embodiment" or the like is not necessarily to only one embodiment, and different references to "an embodiment" or the like are not necessarily to the same embodiment(s).

While terms such as "first" and "second" may be used to identify various components, such components are not limited by such identifiers. The above terms are used only to distinguish one component from another that otherwise have the same or similar names. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Other expressions describing relationships between components such as "~ between," "immediately ~ between" or "adjacent to ~" and "directly adjacent to ~" may be construed similarly.

The terms used in the present application are merely used to describe particular embodiments and are not intended to limit the present disclosure. Singular forms in the present disclosure are intended to include the plural forms and vice versa, unless the context clearly indicates otherwise. It will be further understood that terms such as "including" or "having," and the like, are intended to indicate the existence of the stated features, numbers, operations, actions, components, parts, or combinations thereof, and are not intended to preclude the presence or addition of one or more other features, numbers, operations, actions, components, parts, or combinations thereof.

So far as not being differently defined, all terms used herein including technical or scientific terminologies have meanings that are commonly understood by those skilled in the art to which the present disclosure pertains. The terms having the definitions as defined in the dictionary should be interpreted to have meanings consistent with the context of the related technique. So far as not being clearly defined in this application, terms should not be interpreted in an ideally or excessively formal way.

In describing those embodiments, description of techniques that are well known in the art to which the present disclosure pertains and not directly related to the present disclosure are omitted. Such omission facilitates more clear presentation of the elements and features of the present disclosure.

Various embodiments of the present disclosure will be described in detail with reference to the accompanying drawings in order for those skilled in the art to be able to readily practice the present disclosure.

FIG. 1 is a block diagram illustrating a storage device according to an embodiment of the present disclosure.

Referring to FIG. 1, the storage device 50 may include a memory device 100, a memory controller 200, and a buffer memory 300.

The storage device 50 may be a device for storing data under the control of a host 400, such as a mobile phone, a smart phone, an MP3 player, a laptop computer, a desktop computer, a game console, a TV, a tablet PC or an in-vehicle infotainment.

The storage device 50 may be configured as any one of various types of storage devices according to a host interface protocol for communication with the host 400. For example, the storage device 50 may be implemented as any one of various types of storage devices such as a multi-media card of a Solid State Drive (SSD), a Multi-Media Card (MMC), an embedded, Multi-Media Card (eMMC), a Reduced Size, Multi-Media Card (RS-MMC), and a micro-Multi-Media Card (micro-MMC) type, a Secure Digital (SD) card of a Secure Digital (SD), a mini-Secure Digital (mini-SD) and a micro-Secure Digital (micro-SD) type, an Universal Storage Bus (USB) storage device, a Universal Flash Storage (UFS) device, a storage device of a Personal Computer Memory Card International Association (PCMCIA) card type, a storage device of a Peripheral Component Interconnection (PCI) card type, a storage device of a PCI-Express (PCI-E) card type, a Compact Flash (CF) card, a smart media card, and a memory stick.

The storage device 50 may be manufactured as any one of various package types. For example, the storage device 50 may be manufactured as any one of a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages. In some embodiments, the page may be a unit for storing data or reading data stored in the memory device 100. The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, by way of example only, the memory device 100 is described as a NAND flash memory.

In an embodiment, the memory device 100 may be implemented in a three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, each of the memory cells in the memory device 100 may be configured as a Single Level Cell (SLC) for storing one data bit. Also, each of the memory cells in the memory device 100 may be configured as a Multi-Level Cell (MLC) for storing two data bits, a Triple Level Cell (TLC) for storing three data bits, or a Quad Level Cell (QLC) for storing four data bits.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 400 and the memory device 100.

In an embodiment, the memory controller 200 may receive data and a Logical Block Address (LBA) from the host 400, and translate the LBA into a Physical Block Address (PBA) representing addresses of memory cells in the memory device 100 in which data is stored. Also, the memory controller 200 may store, in the buffer memory, logical-physical address mapping information that establishes a mapping relationship between the LBA and the PBA.

The memory controller 200 may control the memory device 100 to perform a program operation, a read operation, an erase operation, or the like in response to a request from the host 400. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data without any request from the host 400, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control data exchange between the host 400 and the buffer memory 300. Alternatively, the memory controller 200 may temporarily store system data for controlling the memory device 100 in the buffer memory 300. For example, the memory controller 200 may temporarily store data input from the host 400 in the buffer memory 300, and then transmit the data temporarily stored in the buffer memory 300 to the memory device 100.

In various embodiments, the buffer memory 300 may be used as a working memory or cache memory of the memory controller 1200. The buffer memory 300 may store codes or commands, which are executed by the memory controller 200. Alternatively, the buffer memory 300 may store data processed by the memory controller 200.

In an embodiment, the buffer memory 300 may be implemented with a Dynamic Random Access Memory (DRAM) such as a Double Data Rate Synchronous DRAM (DDR SDRAM), a Low Power Double Data Rate4 (LPDDR4) SDRAM, a Graphics Double Data Rate (GDDR) SDRAM, a Low Power DDR (LPDDR) or a Rambus Dynamic Random Access Memory (RDRAM), or a Static Random Access Memory (SRAM).

In some embodiments, the storage device 50 may not include the buffer memory 300. One or more nonvolatile memory devices external to the storage device 50 may serve as the buffer memory 300.

In an embodiment, the memory controller 200 may control at least two memory devices 100. The memory controller 200 may control the memory devices according to an interleaving scheme so as to improve operational performance.

The host 400 may communicate with the storage device 50 using at least one of various communication protocols such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
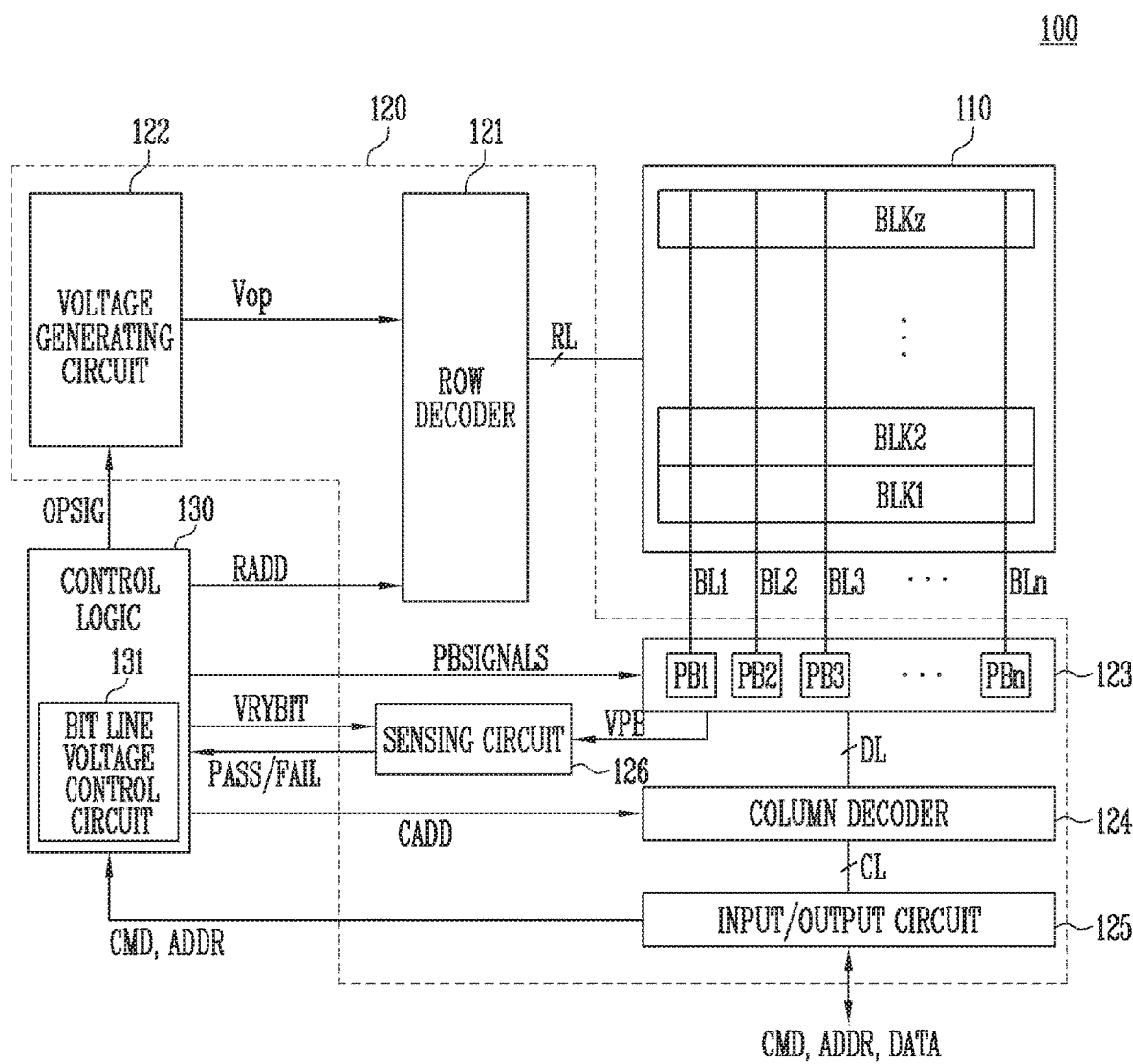
FIG. 2 is a diagram illustrating a structure of an exemplary memory device of FIG. 1.

FIG. 2 is a diagram illustrating a structure of an exemplary memory device of FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to a row decoder 121 through row lines RL. The plurality of memory blocks BLK1 to BLKz may be coupled to a page buffer group 123 through bit lines BL1 to BLn. Each of the plurality of memory blocks BLK1 to BLKz includes a plurality of memory cells. In an embodiment, the plurality of memory cells are nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells in the memory cell array 110 may be configured as a Single Level Cell (SLC) for storing one data bit, a Multi-Level Cell (MLC) for storing two data bits, a Triple Level Cell (TLC) for storing three data bits, or a Quad Level Cell (QLC) for storing four data bits.

The peripheral circuit 120 may be configured to perform a program operation, a read operation or an erase operation in a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn under the control of the control logic 130, or discharge the applied voltages.

The peripheral circuit 120 may include the row decoder 121, a voltage generating circuit 122, the page buffer group 123, a column decoder 124, and an input/output circuit 125.

The row decoder 121 is coupled to the memory cell array through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of the control logic 130. The row decoder 121 receives a row address ADDR from the control logic 130.

The row decoder 121 is configured to decode the row address RADD. The row decoder 121 selects at least one memory block among the memory blocks BLK1 to BLKz according to the decoded address. Also, the address decoder 121 may select at least one word line of the selected memory block to apply voltages generated by the voltage generating circuit 122 to the selected word line(s) WL according to the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage higher than the verify voltage to the unselected word lines. In a read operation, the row decoder 121 may apply a read voltage to the selected word line, and apply a read pass voltage higher than the read voltage to the unselected word lines.

In an embodiment, an erase operation of the memory device 100 is performed in units of memory blocks. In the erase operation, the row decoder 121 may select one memory block according the decoded address. In the erase operation, the row decoder 121 may apply a ground voltage to word lines coupled to the selected memory block.

The voltage generating circuit 122 operates under the control of the control logic 130. The voltage generating circuit 122 may generate a plurality of voltages by using an external power voltage supplied to the memory device 100. Specifically, the voltage generating circuit 122 may generate various operating voltages Vop used for program, read, and erase operation in response to an operation signal OPSIG. For example, the voltage generating circuit 122 may generate a program voltage, a verify voltage, a pass voltage, a read voltage, an erase voltage, and the like under the control of the control logic 130.

In an embodiment, the voltage generating circuit 122 may generate an internal power voltage by regulating the external power voltage. The internal power voltage generated by the voltage generating circuit 122 is used as an operation voltage of the memory device 100.

In an embodiment, the voltage generating circuit 122 may generate a plurality of voltages by using the external power voltage or the internal power voltage.

For example, the voltage generating circuit 122 may include a plurality of pumping capacitors for receiving the internal power voltage, and generate a plurality of voltages by selectively activating the plurality of pumping capacitors under the control of the control logic 130.

The plurality of generated voltages may be supplied to the memory cell array 110 by the row decoder 121.

The page buffer group 123 includes first to nth page buffers PB1 to PBn. The first to nth page buffers PB1 to PBn are coupled to the memory cell array 110 respectively through the first to nth bit lines BL1 to BLn. The first to nth page buffers PB1 to PBn operate under the control of the control logic 130. Specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or sense voltages or currents of the bit lines BL1 to BLn in a read or verify operation.

Specifically, in a program operation, the first to nth page buffers PB1 to PBn may transfer, to selected memory cells, data DATA received through the input/output circuit 125, when a program voltage is applied to a selected word line. The memory cells of the selected page may be programmed according to the transferred data DATA. A memory cell coupled to a bit line to which a program allowable voltage (PAV) (e.g., a ground voltage) is applied may have an increased threshold voltage. The threshold voltage of a memory cell coupled to a bit line to which a program inhibit voltage (VINH) (e.g., a power voltage) is applied may be maintained. In a program verify operation, the first to nth page buffers PB1 to PBn read page data from the selected memory cells through the bit lines BL1 to BLn.

In a read operation, the first to nth page buffers PB1 to PBn may read data DATA from memory cells of a selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL, or exchange data with the input/output circuit 125 through column lines CL.

The input/output circuit 125 may transfer a command CMD and an address ADDR, which are received from the memory controller 200 described with reference to FIG. 1, to the control logic 130, or exchange data DATA with the column decoder 124.

In a read operation or a verify operation, a sensing circuit 126 may generate a reference current in response to an allowable bit signal VRYBIT, and output a pass signal PASS or a fail signal FAIL by comparing a sensing voltage VPB received from the page buffer group 123 with a reference voltage generated by the reference current.

The control logic 130 may control the peripheral circuit by outputting the operation signal OPSIG, the row address RADD, the page buffer control signals PBSIGNALS, and the allowable bit signal VRYBIT in response to the command CMD and the address ADDR. Also, the control logic 130 may determine whether the verify operation has passed or failed in response to the pass or fail signal PASS or FAIL.

The memory cells in the memory cell array 110 may be programmed in any one program state among a plurality of program states according to data stored in each memory cell. A target program state of a memory cell may be determined as any one of the plurality of program states according to data stored in the memory cell.

In an embodiment, the memory device 100 may perform a shadow program operation ("Shadow PGM") on memory cells included in a first memory cell group among memory cells coupled to a selected word line, and perform a normal program operation ("Normal PGM") on memory cells included in the second memory cell group among the memory cells coupled to the selected word line.

The normal program operation ("Normal PGM") is an operation of programming memory cells to be in a target program state corresponding to a program voltage applied to the selected word line.

The shadow program operation (Shadow PGM) is an operation of simultaneously programming memory cells to be in a target program state corresponding to the program voltage applied to the selected word line, and memory cells to be in any one of other target program states.

In order to perform the shadow program operation (Shadow PGM), the control logic 130 may include a bit line voltage control circuit 131.

While the shadow program operation (Shadow PGM) is being performed, the bit line voltage control circuit 131 may apply voltages having different levels to the bit lines such that the memory cells included in the first memory cell group are programmed to their target program states.

When the levels of the bit line voltages applied to the bit lines are adjusted, an increase in threshold voltages of the memory cells may be controlled. The shadow program operation ("Shadow PGM") may be performed by applying, to a bit line, a program control voltage for adjusting a degree to which threshold voltages of target memory cells of the shadow program operation ("Shadow PGM") are increased while a program voltage corresponding to a specific program state is being applied to a word line. The level of the program control voltage may be determined according to a difference in threshold voltage between a target program state of a memory cell coupled to the corresponding bit line and a program state corresponding to the program voltage applied to the word line.

According to an embodiment of the present disclosure, the shadow program operation ("Shadow PGM") is performed on some memory cells coupled to a selected word line, and the normal program operation ("Normal PGM") is performed on the other memory cells coupled to the selected word line. Thus, the time required to perform a program operation can be reduced.

Figure 3:
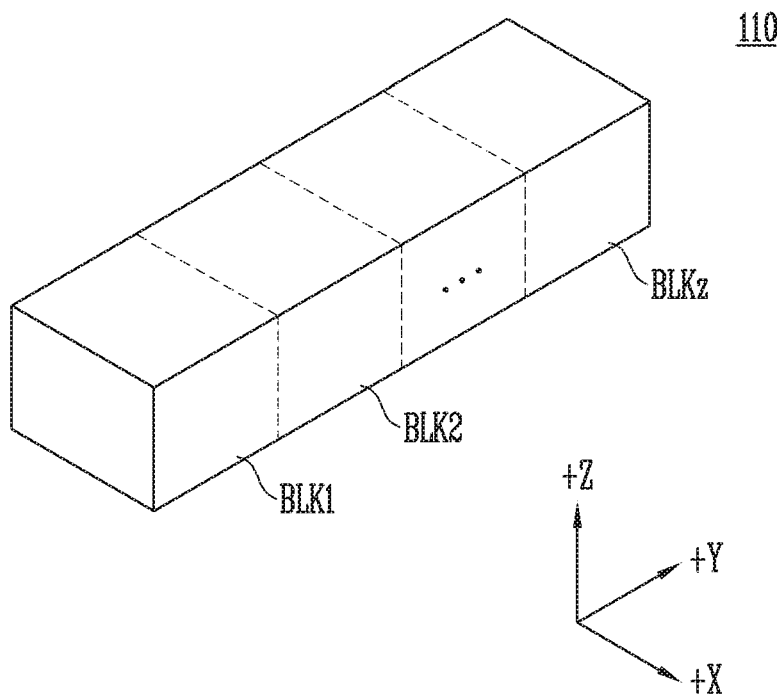
FIG. 3 is a diagram illustrating an embodiment of an exemplary memory cell array of FIG. 2.

FIG. 3 is a diagram illustrating an embodiment of the memory cell array of FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
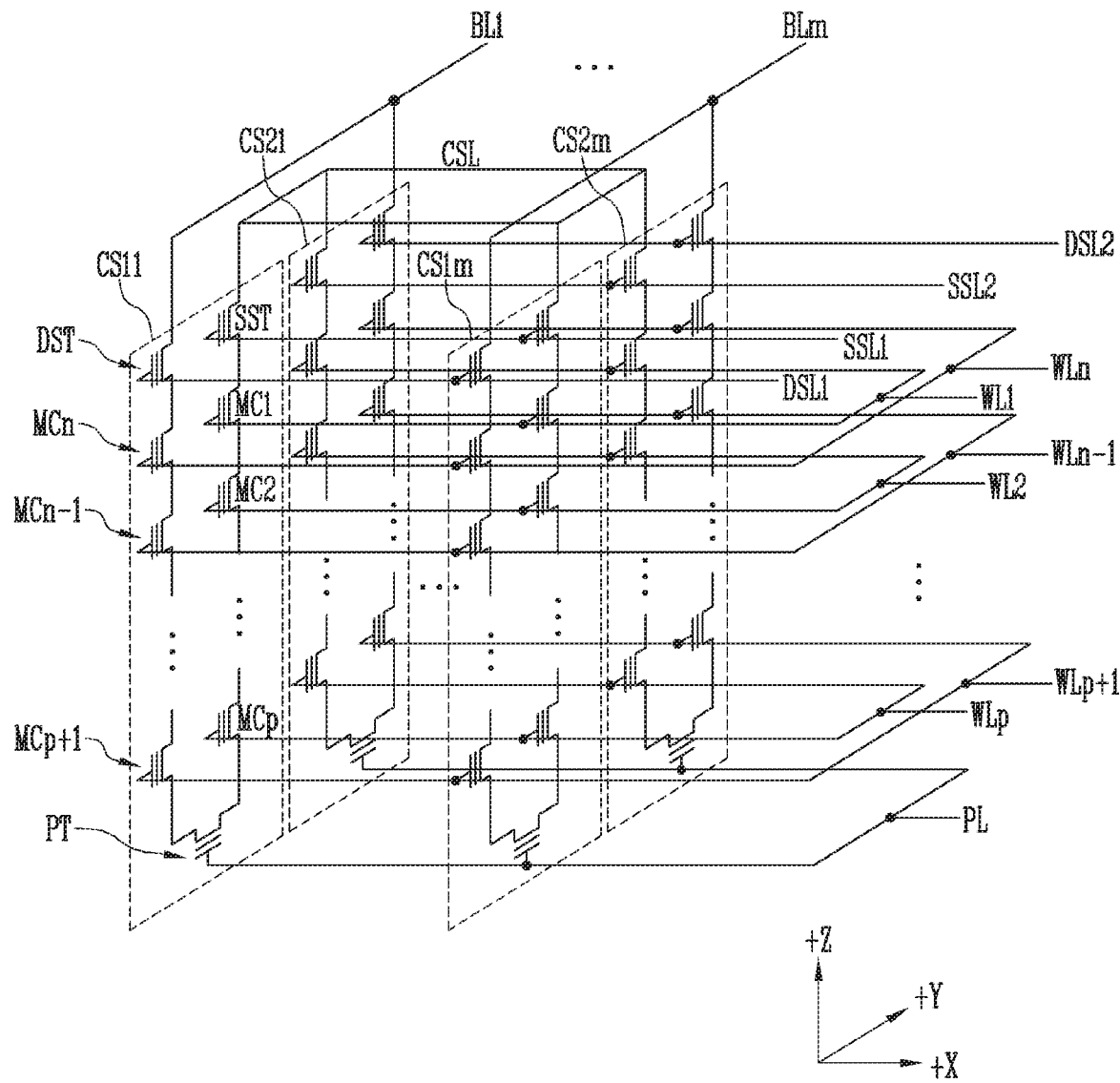
FIG. 4 is a circuit diagram illustrating an embodiment of a memory block among memory blocks of FIG. 3.

FIG. 4 is a circuit diagram illustrating an embodiment of a memory block BLKa among the memory blocks BLK1 to BLKz of FIG. 3.

Referring to FIG. 4, the memory block BLKa may include a plurality of cell strings CS11 to CS1*m* and CS21 to CS2*m*. In an embodiment, each of the plurality of cell strings CS11 to CS1*m* and CS21 to CS2*m* may be formed in a 'U' shape. In the memory block BLKa, m cell strings are arranged in a row direction (i.e., a +X direction). Although FIG. 4 illustrates two cell strings arranged in a column direction (i.e., a +Y direction), the present disclosure is not limited thereto. That is, and the illustration of two cell strings is for clarity; it will be understood that three cell strings may be arranged in the column direction.

Each of the plurality of cell strings CS11 to CS1*m* and CS21 to CS2*m* may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1*m* on a first row are coupled to a first source select line SSL1. The source select transistors of the cell strings CS21 to CS2*m* on a second row are coupled to a second source select line SSL2.

In another embodiment, the source select transistors of the cell strings CS11 to CS1*m* and CS21 to CS2*m* may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the −Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells is increased, the reliability of an operation of the memory block BLKa is improved. On the other hand, the size of the memory block BLKa is increased. When the number of dummy memory cells is decreased, the size of the memory block BLKa is decreased. On the other hand, the reliability of an operation of the memory block BLKa may be deteriorated.

In order to efficiently control the dummy memory cell(s), each may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
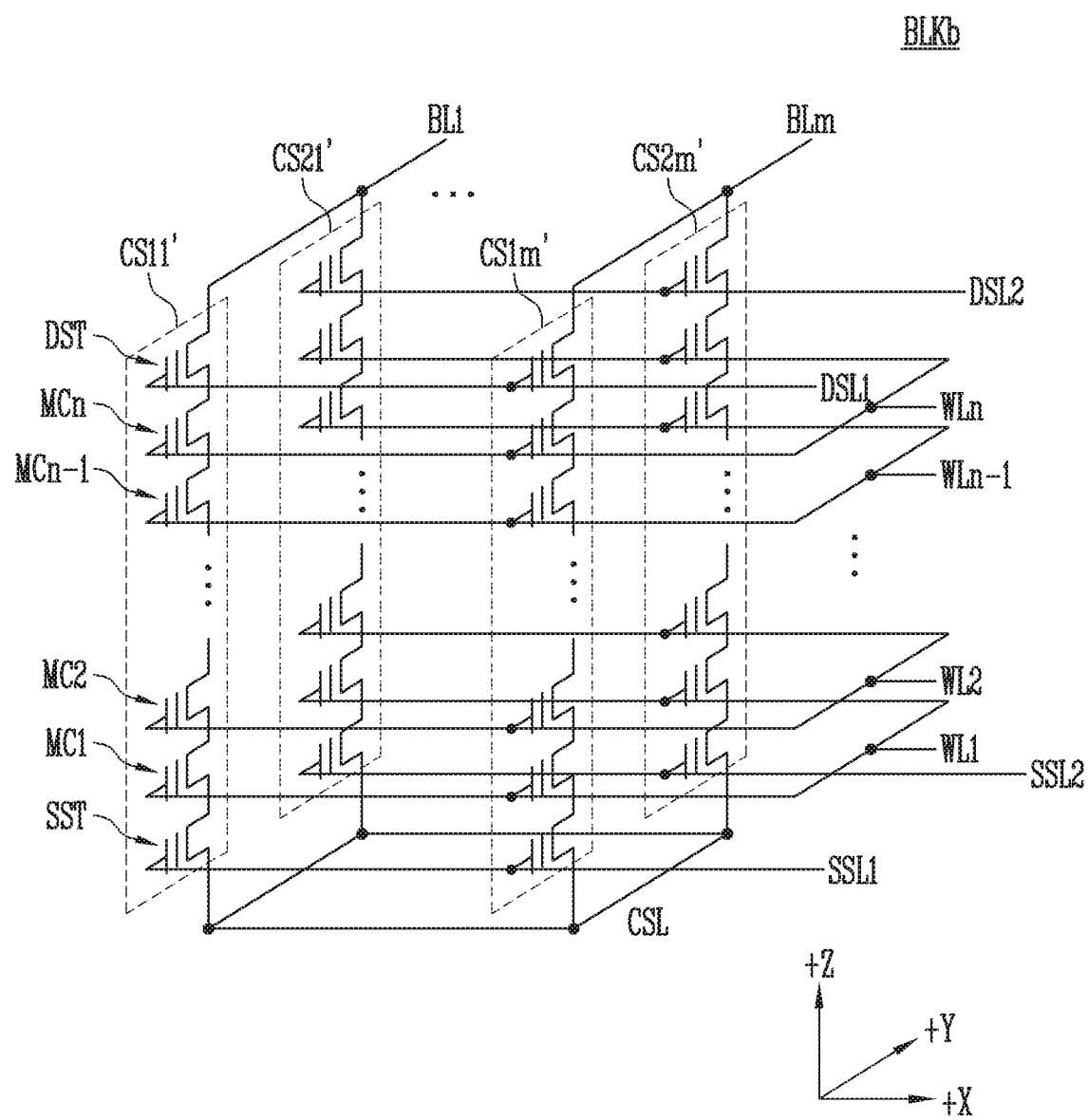
FIG. 5 is a circuit diagram illustrating another embodiment of a memory block among the memory blocks of FIG. 3.

FIG. 5 is a circuit diagram illustrating another embodiment BLKb of the one memory block among the memory blocks BLK1 to BLKz of FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When a larger number of dummy memory cells are provided, the reliability of an operation of the memory block BLKb is improved. On the other hand, the size of the memory block BLKb is increased. When the number of dummy memory cells is decreased, the size of the memory block BLKb is decreased.

On the other hand, the reliability of an operation of the memory block BLKb may be deteriorated.

In order to efficiently control the dummy memory cell(s), each may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

FIGS. 6A to 6D are diagrams illustrating threshold voltage distributions according to numbers of data bits stored in memory cells according to an embodiment of the disclosure.

Referring to FIGS. 6A to 6D, the horizontal axis represents threshold voltages according to states of memory cells, and the vertical axis represents numbers of memory cells.

The memory device may perform a program operation in units of pages. A plurality of memory cells coupled to one word line may constitute one page. The page may be a unit of a program operation or read operation.

The memory device may program memory cells coupled to a selected word line among a plurality of word lines according to data to be stored.

Selected memory cells that are coupled to the selected word line may have a threshold voltage distribution corresponding to an erase state E before a program operation is performed.

Figure 6A:
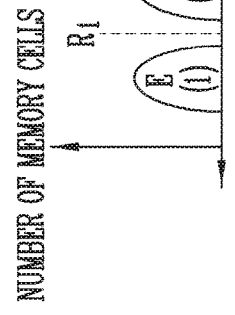
FIGS. 6A to 6D are diagrams illustrating threshold voltage distributions according to numbers of data bits stored in memory cells according to an embodiment of the present disclosure.

FIG. 6A is a case where each memory cell stores data corresponding to one bit. The memory cell may be programmed to have a threshold voltage corresponding to any one of the erase state E and a first program state P1.

The erase state E may correspond to data '1,' and the first program state P1 may correspond to data '0.' However, this convention is exemplary and may be reversed. That is, the erase state E may correspond to data '0,' and the first program state P1 may correspond to data '1.'

The memory device may read data stored in the selected memory cells by performing a read operation using a first read voltage R1 between the erase state E and the first program state P1.

Figure 6B:
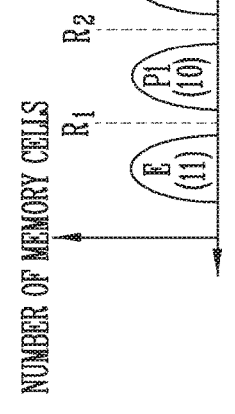

FIG. 6B is a case where each memory cell stores data corresponding to two bits. The memory cell may be programmed to have a threshold voltage corresponding to any one of an erase state E, a first program state P1, a second program state P2, and a third program state P3.

The erase state E may correspond to data '11,' the first program state P1 may correspond to data '10,' the second program state P2 may correspond to data '00,' and the third program state P3 may correspond to data '01.' However, this convention is exemplary, and as such may be variously modified.

The memory device may read data stored in the selected memory cells by performing a read operation using first to third read voltages R1 to R3.

The first read voltage R1 may be for distinguishing the erase state E and the first program state P1 from each other, the second read voltage R2 may be for distinguishing the first program state P1 and the second program state P2 from each other, and the third read voltage R3 may be for distinguishing the second program state P2 and the third program state P3 from each other.

Figure 6C:
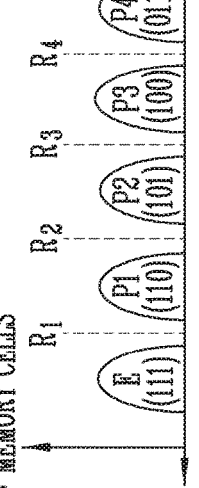

FIG. 6C is a case where each memory cell stores data corresponding to three bits. The memory cell may be programmed to have a threshold voltage corresponding to any one of an erase state E, a first program state P1, a second program state P2, a third program state P3, a fourth program state P4, a fifth program state P5, a sixth program state P6, and a seventh program state P7.

The erase state E may correspond to data '111,' the first program state P1 may correspond to data '110,' the second program state P2 may correspond to data '101,' the third program state P3 may correspond to data '100,' the fourth program state P4 may correspond to data '011,' the fifth program state P5 may correspond to data '010,' the sixth program state P6 may correspond to data '001,' and the seventh program state P7 may correspond to data '000.' However, this convention is exemplary, and as such may be variously modified.

The memory device may read data stored in the selected memory cells by performing a read operation using first to seventh read voltages R1 to R7.

The first read voltage R1 may be for distinguishing the erase state E and the first program state P1 from each other, the second read voltage R2 may be for distinguishing the first program state P1 and the second program state P2 from each other, the third read voltage R3 may be for distinguishing the second program state P2 and the third program state P3 from each other, the fourth read voltage R4 may be for distinguishing the third program state P3 and the fourth program state P4 from each other, the fifth read voltage R5 may be for distinguishing the fourth program state P4 and the fifth program state P5 from each other, the sixth read voltage R6 may be for distinguishing the fifth program state P5 and the sixth program state P6 from each other, and the seventh read voltage R7 may be for distinguishing the sixth program state P6 and the seventh program state P7 from each other.

Figure 6D:
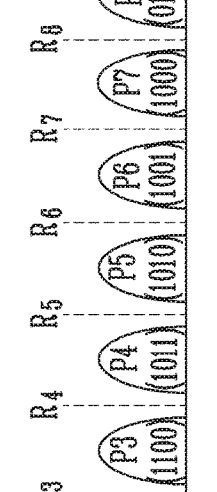
Figure 6D:
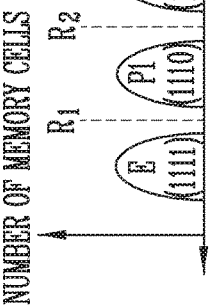

FIG. 6D is a case where each memory cell stores data corresponding to four bits. The memory cell may be programmed to have a threshold voltage corresponding to any one of an erase state E and first to fifteenth program states P1 to P15.

The erase state E may correspond to data '1111,' the first program state P1 may correspond to data '1110,' the second program state P2 may correspond to data '1101,' the third program state P3 may correspond to data '1100,' the fourth program state P4 may correspond to data '1011,' the fifth program state P5 may correspond to data '1010,' the sixth program state P6 may correspond to data '1001,' and the seventh program state P7 may correspond to data '1000.' In addition, the eighth program state P8 may correspond to data '0111,' the ninth program state P9 may correspond to data '0110,' the tenth program state P10 may correspond to data '0101,' the eleventh program state P11 may correspond to data '0100,' the twelfth program state P12 may correspond to data '0011,' the thirteenth program state P13 may correspond to data '0010,' the fourteenth program state P14 may correspond to data '0001,' and the fifteenth program state P15 may correspond to data '0000.' However, this convention is exemplary, and as such may be variously modified.

The memory device may read data stored in the selected memory cells by performing a read operation using first to fifteenth read voltages R1 to R15.

The first read voltage R1 may be for distinguishing the erase state E and the first program state P1 from each other, the second read voltage R2 may be for distinguishing the first program state P1 and the second program state P2 from each other, the third read voltage R3 may be for distinguishing the second program state P2 and the third program state P3 from each other, the fourth read voltage R4 may be for distinguishing the third program state P3 and the fourth program state P4 from each other, the fifth read voltage R5 may be for distinguishing the fourth program state P4 and the fifth program state P5 from each other, the sixth read voltage R6 may be for distinguishing the fifth program state P5 and the sixth program state P6 from each other, the seventh read voltage R7 may be for distinguishing the sixth program state P6 and the seventh program state P7 from each other, the eighth read voltage R8 may be for distinguishing the seventh program state P7 and the eighth program state P8 from each other, the ninth read voltage R9 may be for distinguishing the eighth program state P8 and the ninth program state P9 from each other, the tenth read voltage R10 may be for distinguishing the ninth program state P9 and the tenth program state P10, the eleventh read voltage R11 may be for distinguishing the tenth program state P10 and the eleventh program state P11 from each other, the twelfth read voltage R12 may be for distinguishing the eleventh program state P11 and the twelfth program state P12 from each other, the thirteenth read voltage R13 may be for distinguishing the twelfth program state P12 and the thirteenth program state P13 from each other, and a fourteenth read voltage R14 may be for distinguishing the thirteenth program state P13 and the fourteenth program state P14 from each other, and the fifteenth read voltage R15 may be for distinguishing the fourteenth program state P14 and the fifteenth program state P15 from each other.

Figure 7:
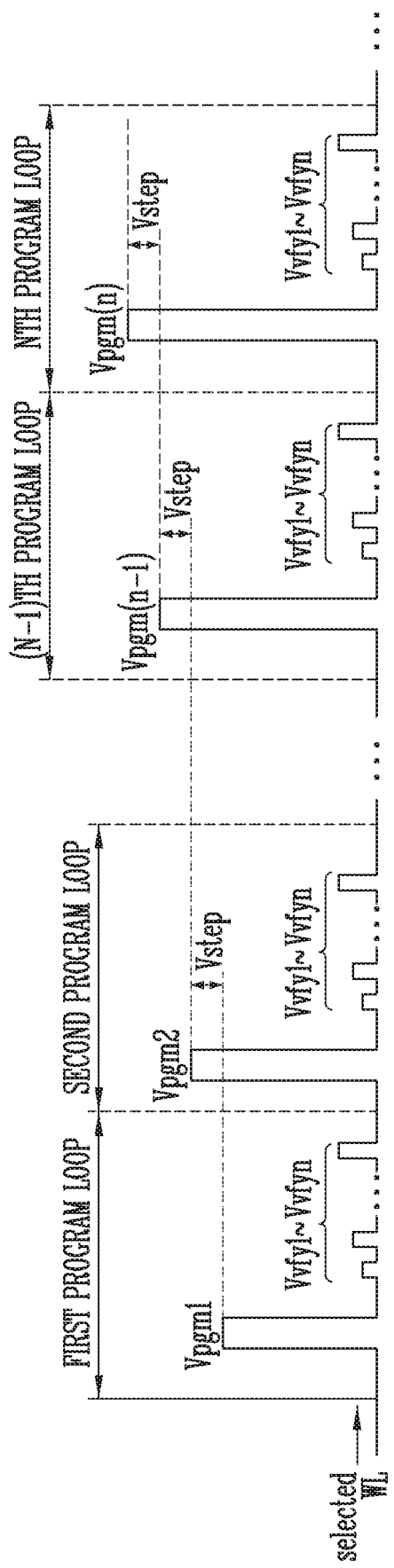
FIG. 7 is a diagram illustrating a normal program operation according to an embodiment of the present disclosure.

FIG. 7 is a diagram illustrating a normal program operation.

Referring to FIG. 7, the normal program operation ("Normal PGM") may include a plurality of program loops PL1 to PLn. That is, the memory device 100 may perform the plurality of program loops PL1 to PLn such that selected memory cells have a threshold voltage corresponding to any one state among a plurality of program states. Each of the plurality of program loops PL1 to PLn may include a program voltage applying step of applying a program voltage and a verify step of determining whether memory cells have been programmed to be in the target program states by applying verify voltages.

For example, when a first program loop PL1 is performed, first to nth verify voltages Vvfy1 to Vvfyn are sequentially applied to verify program states of a plurality of memory cells after a first program voltage Vpgm1 is applied. A verify operation of memory cells of which target program state is a first program state P1 may be performed by a first verify voltage Vvfy1, a verify operation of memory cells of which target program state is a second program state P2 may be performed by a second verify voltage Vvfy2, and a verify operation of memory cells of which target program state is a third program state P3 may be performed by a third verify voltage Vvfy3.

Memory cells of which verify operation has passed are determined to be in the target program state, and may be program-inhibited in a subsequent second program loop PL2. That is, a program inhibit voltage VINH may be applied to bit lines coupled to the memory cells of which verify operation has passed. In an embodiment, the program inhibit voltage may be a power voltage Vcc.

The verify operation of memory cells of which threshold voltages do not reach their target program states may fail. A program allowable voltage PAV may be applied to bit lines coupled to the memory cells of verify has failed. In an embodiment, the program allowable voltage may be a ground voltage (0V).

A second program voltage Vpgm2 higher by a step voltage Vstep than the first program voltage Vpgm1 is applied to program the other memory cells, i.e., those except the program-inhibited memory cells, in the second program loop PL2. After this, a verify operation is performed identically to that of the first program loop PL1. In an example, that the verify operation has passed may mean that memory cells are read as off-cells by a corresponding voltage.

In the verify operation, a verify voltage is applied to a selected word line that is a word line to selected memory cells, and a page buffer may determine whether a verify operation of memory cells has passed, based on currents or voltages applied through bit lines respectively coupled to the selected memory cells.

Figure 8A:
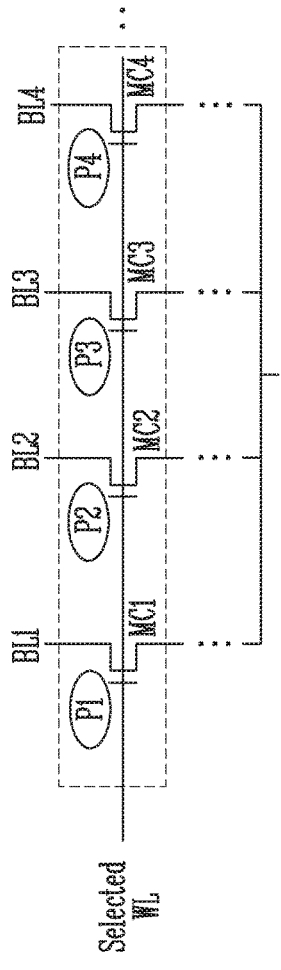
FIGS. 8A to 8B are diagrams illustrating a shadow program operation according to an embodiment of the present disclosure.
Figure 8B:
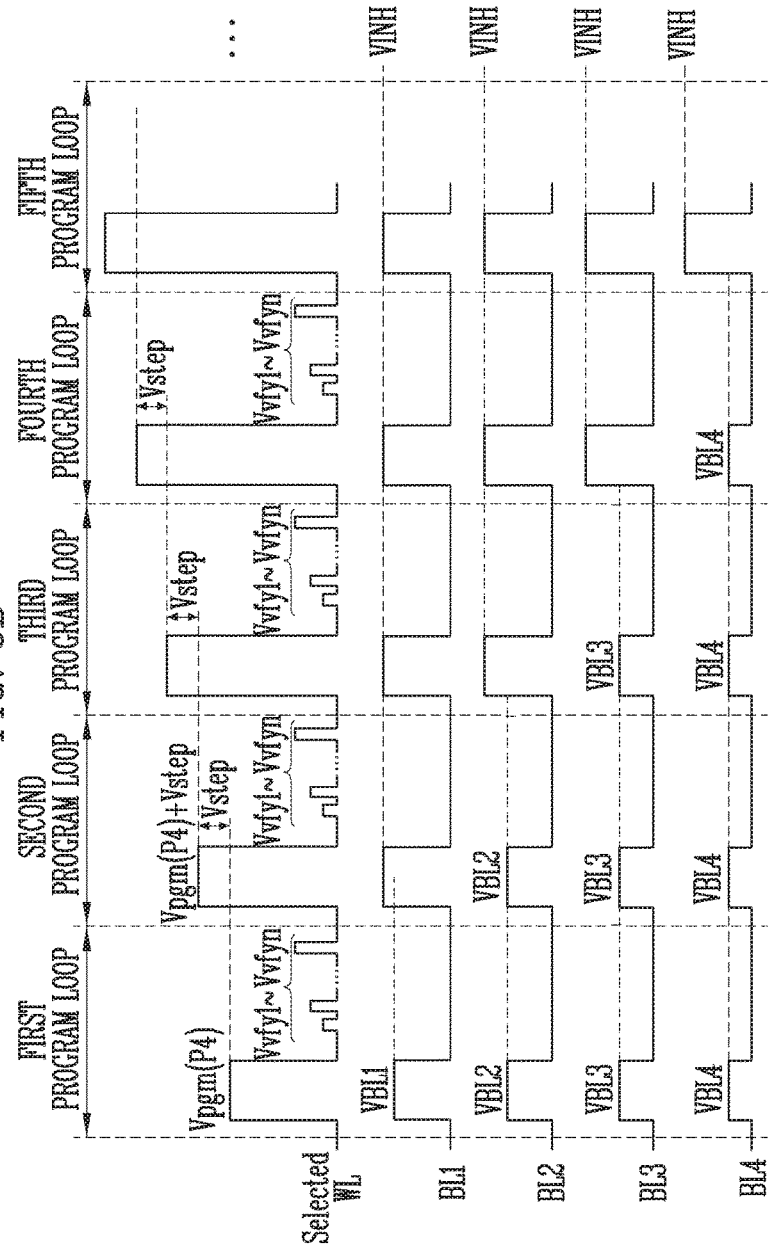

FIGS. 8A to 8B are diagrams illustrating a shadow program operation.

The shadow program operation ("Shadow PGM") is an operation of simultaneously programming memory cells to be in a target program state corresponding to a program voltage, and programming other memory cells to be in, as a target program state, any one of program states different from the program state corresponding to the program voltage.

The shadow program operation ("Shadow PGM") may include a plurality of program loops PL1 to PLn. That is, the memory device 100 may perform the plurality of program loops PL1 to PLn such that selected memory cells have a threshold voltage corresponding to any one state among a plurality of program states. Each of the plurality of program loops PL1 to PLn may include a program voltage applying step of applying a program voltage and a verify step of determining whether memory cells have been programmed to be in the target program states by applying verify voltages.

FIG. 8A illustrates some of memory cells coupled to a selected word line.

In FIGS. 8A to 8B, for clarity of illustration and ease of description, a case where the shadow program operation ("Shadow PGM") is performed on first to fourth memory cells MC1 to MC4 among a plurality of memory cells coupled to a selected word line is described by way of example.

The first memory cell MC1 is to be in a first program state P1 as a target program state, the second memory cell MC2 is to be in a second program state P2 as a target program state, the third memory cell MC3 is to be in a third program state P3 as a target program state, and the fourth memory cells MC4 is to be in a fourth program state P4 as a target program state.

While a program voltage is being applied to the word line, program control voltages having different levels may be respectively applied to bit lines BL1 to BL4 coupled to the first to fourth memory cells MC1 to MC4.

FIG. 8B illustrates voltages applied to the word line and the bit lines in first to fifth program loops PL1 to PL5 among a plurality of program loops.

First to fourth bit lines BL1 to BL4 are coupled to the first to fourth memory cells MC1 to MC4, respectively. In the shadow program operation ("Shadow PGM"), program control voltages VBL1 to VBL4 having different levels may be applied to the bit lines, respectively.

In the first program loop PL1, a program voltage may be applied to a selected word line after the program control voltages VBL1 to VBL4 are respectively applied to the first to fourth bit lines BL1 to BL4. In an embodiment, the program voltage may be a program voltage Vpgm(p4) corresponding to the fourth program state P4. That is, a program voltage corresponding to the program state P4 that is highest among target program states of memory cells on which the shadow program operation ("Shadow PGM") is performed may be applied to the selected word line.

In an embodiment, as the first to fourth program loops are performed, the program voltage in a subsequent loop may increase by a step voltage Vstep relative to that applied in the previous program loop. For example, the program voltage applied in the second program loop may be higher than that in the first program loop by the step voltage Vstep, the program voltage applied in the third program loop may be higher than that in the second program loop by the step voltage Vstep, and the program voltage applied in the fourth program loop may be higher than that in the third program loop by the step voltage Vstep.

After the program voltage Vpgm(p4) is applied, verify voltages Vvfy1 to Vvfyn may be applied to the selected word line. Specifically, first to fourth verify voltages Vvfy1 to Vvfy4 are sequentially applied to the selected word line so as to verify the program state of each of the first to fourth memory cells MC1 to MC4. A verify operation of memory cells of which target program state is the first program state P1 may be performed by the first verify voltage Vvfy1, a verify operation of memory cells of which target program state is the second program state P2 may be performed by the second verify voltage Vvfy2, a verify operation of memory cells of which target program state is the third program state P3 may be performed by the third verify voltage Vvfy3, and a verify operation of memory cells of which target program state is the fourth program state P4 may be performed by the fourth verify voltage Vvfy4.

In FIGS. 8A to 8B, it is assumed that a verify operation of the first memory cell MC1 passes in the first program loop PL1. Therefore, in the second program loop PL2, a program inhibit voltage VINH is applied to the bit line BL1 coupled to the first memory cell MC1 of which verify operation has passed. The program control voltages VBL2 to VBL4 applied in the first program loop PL1 are applied to the bit lines BL2 to BL4 coupled to memory cells of which verify operation has not passed.

It is assumed that a verify operation of the second memory cells MC2 passes in the second program loop PL2. Therefore, in the third program loop PL3, the program inhibit voltage VINH is applied to the bit lines BL1 and BL2 coupled to the memory cells MC1 and MC2 of which verify operation has passed. The program control voltages VBL3 and VBL4 applied in the first program loop PL1 are applied to the bit lines BL3 and BL4 coupled to the memory cells MC3 and MC4 of which verify operation has not passed. After the program inhibit voltage VINH and the program control voltages VBL3 and VBL4 are applied to the bit lines BL1 to BL4, a program voltage may be applied to the selected word line.

It is assumed that a verify operation of the third memory cell MC3 passes in the third program loop PL3. Therefore, in the fourth program loop PL4, the program inhibit voltage VINH is applied to the bit lines BL1 to BL3 coupled to the memory cells MC1 to MC3 of which verify operation has passed. The program control voltage VBL4 applied in the first program loop PL1 is applied to the bit line BL4 coupled to the memory cell of which verify operation has not passed. After the program inhibit voltage VINH and the program control voltage VBL4 are applied to the bit lines BL1 to BL4, a program voltage may be applied to the selected word line.

It is assumed that a verify operation of the fourth memory cell MC4 passes in the fourth program loop PL4. Therefore, in the fifth program loop PL5, the program inhibit voltage VINH is applied to the bit lines BL1 to BL4 coupled to the memory cells MC1 to MC4 of which verify operation has passed.

Referring to FIGS. 8A to 8B, through the shadow program operation ("Shadow PGM"), the memory cells MC1 to MC4 having the first to fourth program states P1 to P4 as target program states can be simultaneously programmed while a program voltage corresponding to the fourth program state P4 is being applied to the selected word line.

Figure 9:
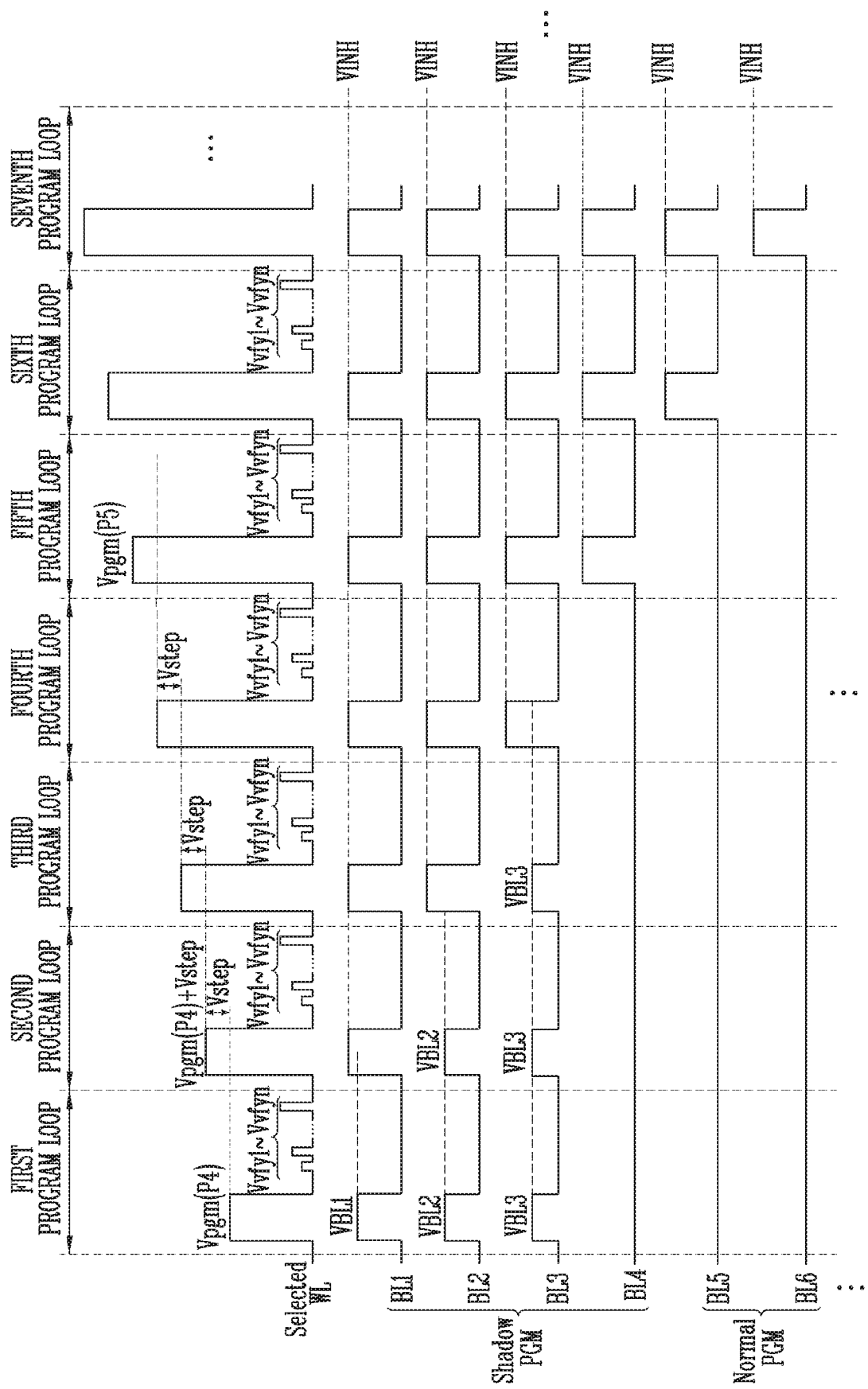
FIG. 9 is a diagram illustrating a program method according to an embodiment of the present disclosure.

FIG. 9 is a diagram illustrating a program method according to an embodiment of the present disclosure.

In FIG. 9, by way of example, a case where, among a plurality of memory cells coupled to a selected word line, a shadow program operation ("Shadow PGM") is performed on first to fourth memory cells MC1 to MC4 and a normal program operation ("Normal PGM") is performed on fifth and sixth memory cells MC5 and MC6 is described. The first to sixth memory cells MC1 to MC6 may be coupled to first to sixth bit lines BL1 to BL6, respectively.

The first memory cell MC1 is to be in a first program state P1 as a target program state, the second memory cell MC2 is to be in a second program state P2 as a target program state, the third memory cell MC3 is to be in a third program state P3 as a target program state, the fourth memory cell MC4 is to be in a fourth program state P4 as a target program state, the fifth memory cell MC5 is to be in a fifth program state P5 as a target program state, and the sixth memory cell MC6 is to be in a sixth program state P6 as a target program state.

FIG. 9 illustrates voltages applied to the word line and the bit lines in first to seventh program loops PL1 to PL7 among a plurality of program loops.

The first to fourth memory cells MC1 to MC4 respectively coupled to the first to fourth bit lines BL1 to BL4 may be programmed according to the shadow program operation ("Shadow PGM") described with reference to FIGS. 8A to 8B.

In FIG. 9, verify operations of the first to fourth memory cells MC1 to MC4 pass in the first to fourth program loops PL1 to PL4, respectively. Therefore, in the fifth to seventh program loops PL5 to PL7, a program inhibit voltage VINH may be applied to the bit lines BL1 to BL4 coupled to the memory cells MC1 to MC4 of which verify operation has passed. After the program inhibit voltage VINH is applied to the bit lines BL1 to BL4, a program voltage may be applied to the selected word line.

In the fifth program loop PL5, the normal program operation ("Normal PGM") is performed on the fifth memory cell MC5.

A program voltage Vpgm(p5) corresponding to the fifth program state P5 may be applied to the selected word line Selected WL. While the program voltage is being applied, a program allowable voltage PAV (e.g., a ground voltage) may be applied to each of the bit lines coupled to the fifth and sixth memory cells MC5 and MC6.

A verify operation of the fifth memory cell MC5 passes in the fifth program loop PL5.

In the sixth program loop PL6, the normal program operation ("Normal PGM") is performed on the sixth memory cell MC6.

The program inhibit voltage VINH is applied to the bit lines BL1 to BL5 coupled to the memory cells MC1 to MC5 of which verify operation has passed. The program allowable voltage PAV is applied to the bit line BL6 coupled to the memory cell MC6 of which verify operation has not passed.

After the voltages are applied to the bit lines, a program voltage may be applied to the selected word line Selected WL. In an embodiment, the program voltage applied in the sixth program loop may be a program voltage Vpgm(p6) corresponding to the sixth program state P6.

After the program voltage is applied, verify voltages Vvfy1 to Vvfyn may be applied to the selected word line Selected WL. Specifically, first to sixth verify voltages Vvfy1 to Vvfy6 are sequentially applied to the selected word line so as to verify the program state of each of the first to sixth memory cells MC1 to MC6. A verify operation of memory cells of which target program state is the first program state P1 may be performed by the first verify voltage Vvfy1, a verify operation of memory cells of which target program state is the second program state P2 may be performed by the second verify voltage Vvfy2, a verify operation of memory cells of which target program state is the third program state P3 may be performed by the third verify voltage Vvfy3, a verify operation of memory cells of which target program state is the fourth program state P4 may be performed by the fourth verify voltage Vvfy4, a verify operation of memory cells of which target program state is the fifth program state P5 may be performed by the fifth verify voltage Vvfy5, and a verify operation of memory cells of which target program state is the sixth program state P6 may be performed by the sixth verify voltage Vvfy6.

The verify operation of the sixth memory cell MC6 passes in the sixth program loop PL6.

Figure 10:
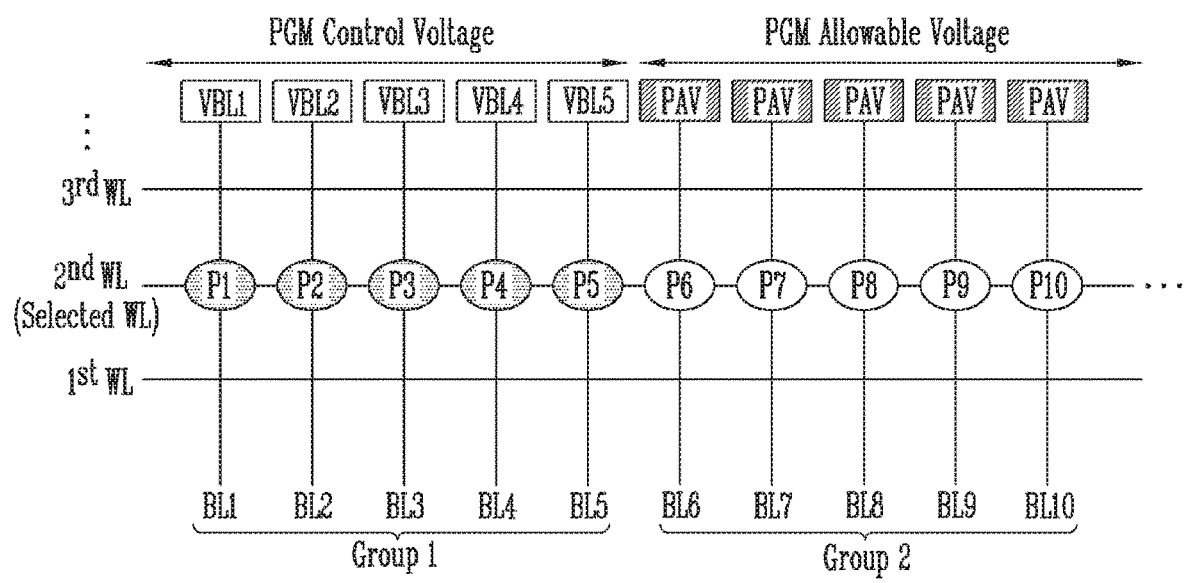
FIG. 10 is a diagram illustrating a memory cell group on which a shadow program operation is performed according to an embodiment of the present disclosure.

FIG. 10 is a diagram illustrating a memory cell group on which a shadow program operation is performed according to an embodiment of the present disclosure.

In FIG. 10, by way of example, the selected word line among a plurality of word lines is a second word line $2^{nd}$ WL. Also by way of example, in FIG. 10, first to tenth memory cells coupled to the selected word line $2^{nd}$ WL and first to tenth bit lines BL1 to B10 are to be in first to tenth program states P1 to P10 as target program states.

The memory cells coupled to the selected word line may be divided into a first memory cell group Group1 and a second memory cell group Group2. FIG. 10 illustrates first to fifth memory cells as the first memory cell group Group1 and sixth to tenth memory cells as the second memory cell group Group2.

Each of the memory cells shown in FIG. 10 may be a Quad Level Cell (QLC) capable of storing four data bits. The QLC may correspond to any one state among an erase state and first to fifteenth program states P1 to P15.

According to the embodiment of FIG. 10, target program states of memory cells on which a shadow program operation ("Shadow PGM") is to be performed may be determined as at least two consecutive program states among a plurality of program states. For example, the first memory cell group Group1 may include first to fifth memory cells to be in any one of the first to fifth program states P1 to P5 as a target program state. The second memory cell group Group2 may include sixth to tenth memory cells to be in, as a target program state, any one of the sixth to tenth program states P6 to P10. A shadow program operation ("Shadow PGM") may be performed on memory cells included in the first memory cell group Group1, and a normal program operation ("Normal PGM") may be performed on memory cells included in the second memory cell group Group2.

As a memory cell is to be in higher program state, among the P1 to P10 program states, the threshold voltage thereof becomes higher.

A program voltage corresponding to the highest target program state (e.g., program state P5) among the target program states (e.g., program states P1 to P5) of the first to fifth memory cells on which the shadow program operation ("Shadow PGM") is performed may be applied to the selected word line during the shadow program operation ("Shadow PGM").

Program control voltages (PGM control voltages) VBL1 to VBL5 for the shadow program operation ("Shadow PGM") may be applied to bit lines BL1 to BL5 coupled to the first to fifth memory cells in the first memory cell group Group1. The PGM control voltages VBL1 to VBL5 may have different levels according to target program states P1 to P5. In an embodiment, the level of each of the PGM control voltages VBL1 to VBL5 may be determined according to a difference in threshold voltage between a target program state P1 to P5 of a memory cell coupled to a corresponding bit line and a program state P5 corresponding to the program voltage applied to the selected word line.

The PGM control voltage VBL1 applied to the first bit line BL1 may have the highest voltage level, and the PGM control voltage VBL5 applied to the fifth bit line BL5 may have the lowest voltage level. That is, as the target program state of a memory cell coupled to a bit line becomes lower, a PGM control voltage having a higher voltage level may be applied.

A program allowable voltage (PGM allowable voltage) PAV may be applied to bit lines coupled to the sixth to tenth memory cells included in the second memory cell group Group2. In an embodiment, the PGM allowable voltage may be a ground voltage (0V). When a program verify operation on the memory cells coupled to the first to fifth bit lines BL1 to BL5 passes, a normal program operation ("Normal PGM") may be performed on the sixth to tenth memory cells coupled to the sixth to tenth bit lines BL6 to BL10.

Figure 11:
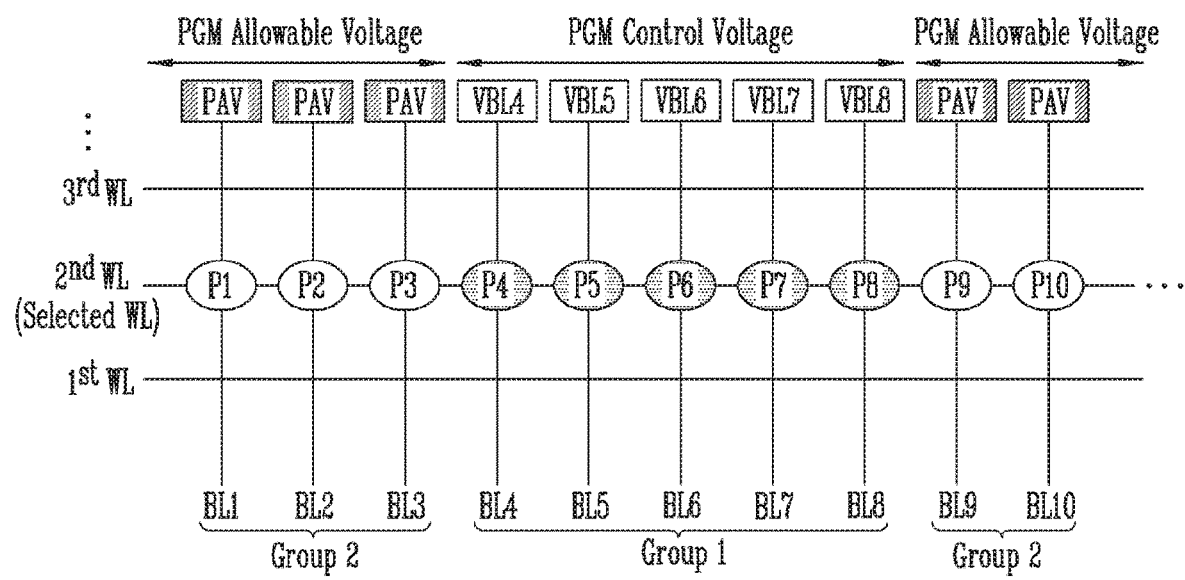
FIG. 11 is a diagram illustrating a memory cell group on which a shadow program operation is performed according to another embodiment of the present disclosure.

FIG. 11 is a diagram illustrating a memory cell group on which a shadow program operation is performed according to another embodiment of the present disclosure.

In FIG. 11, it is assumed that a selected word line among a plurality of word lines is a second word line $2^{nd}$ WL. In FIG. 10, it is assumed that first to tenth memory cells coupled to the selected word line $2^{nd}$ WL and first to tenth bit lines BL1 to BL10 are to be in first to tenth program states P1 to P10 as target program states.

Memory cells coupled to the selected word line may be divided into a first memory cell group Group1 and a second memory cell group Group2. FIG. 11 illustrates fourth to eighth memory cells as the first memory cell group Group1 and first to third and ninth and tenth memory cells as the second memory cell group Group2. A shadow program operation ("Shadow PGM") may be performed on memory cells in Group1, and a normal program operation ("Normal PGM") may be performed on memory cells Group2.

Each of the memory cells shown in FIG. 11 may be a Quad Level Cell (QLC) capable of storing four data bits. The QLC may correspond to any one state among an erase state and first to fifteenth program states P1 to P15.

According to the embodiment of FIG. 11, target program states of memory cells on which a shadow program operation ("Shadow PGM") is to be performed may be determined as at least two consecutive program states among a plurality of program states. For example, the first memory cell group Group1 may include memory cells to be in any one of the fourth to eighth program states P4 to P8 as a target program state. The second memory cell group Group2 may include memory cells to be in, as a target program state, any one of the first to third program states P1 to P3 and the ninth to fifteenth program states P9 to P15. A shadow program operation ("Shadow PGM") may be performed on the memory cells included in the first memory cell group Group1, and a normal program operation ("Normal PGM") may be performed on the memory cells included in the second memory cell group Group2.

As a memory cell is to be in higher program state, among the P1 to P10 program states, the threshold voltage thereof becomes higher.

A program voltage corresponding to the highest target program state (e.g., P8) among the target program states (e.g., P4 to P8) of the fourth to eighth memory cells on which the shadow program operation ("Shadow PGM") is performed may be applied to the selected word line during the shadow program operation ("Shadow PGM").

Program control voltages (PGM control voltages) VBL4 to VBL8 for the shadow program operation ("Shadow PGM") may be applied to bit lines BL4 to BL8 coupled to the fourth to eighth memory cells in the first memory cell group Group1. The PGM control voltages VBL4 to VBL8 may have different levels according to target program states P4 to P8. In an embodiment, the level of each of the PGM control voltages P4 to P8 may be determined according to a difference in threshold voltage between a target program state P4 to P8 of a memory cell coupled to a corresponding bit line and a program state P8 corresponding to the program voltage applied to the selected word line.

Among the PGM control voltages, the PGM control voltage VBL4 applied to the fourth bit line BL4 may have the highest voltage level, and the PGM control voltage VBL8 applied to the eighth bit line BL8 may have the lowest voltage level. That is, as the target program state of a memory cell coupled to a bit line becomes lower, a PGM control voltage having a higher voltage level may be applied.

A program allowable voltage (PGM allowable voltage) PAV may be applied to bit lines BL1 to BL3, BL9, and BL10 coupled to the first to third and ninth and tenth memory cells in the second memory cell group Group2. In an embodiment, the PGM allowable voltage may be a ground voltage (0V). When a program verify operation on the memory cells coupled to the first to third bit lines BL1 to BL3 passes, a shadow program operation ("Shadow PGM") may be performed on the memory cells coupled to the fourth to eighth bit lines BL4 to BL8. When a program verify operation on the memory cells coupled to the fourth to eighth bit lines BL4 to BL8 passes, a normal program operation ("Normal PGM") may be performed on the memory cells coupled to the ninth and tenth bit lines BL9 and BL10.

Figure 12:
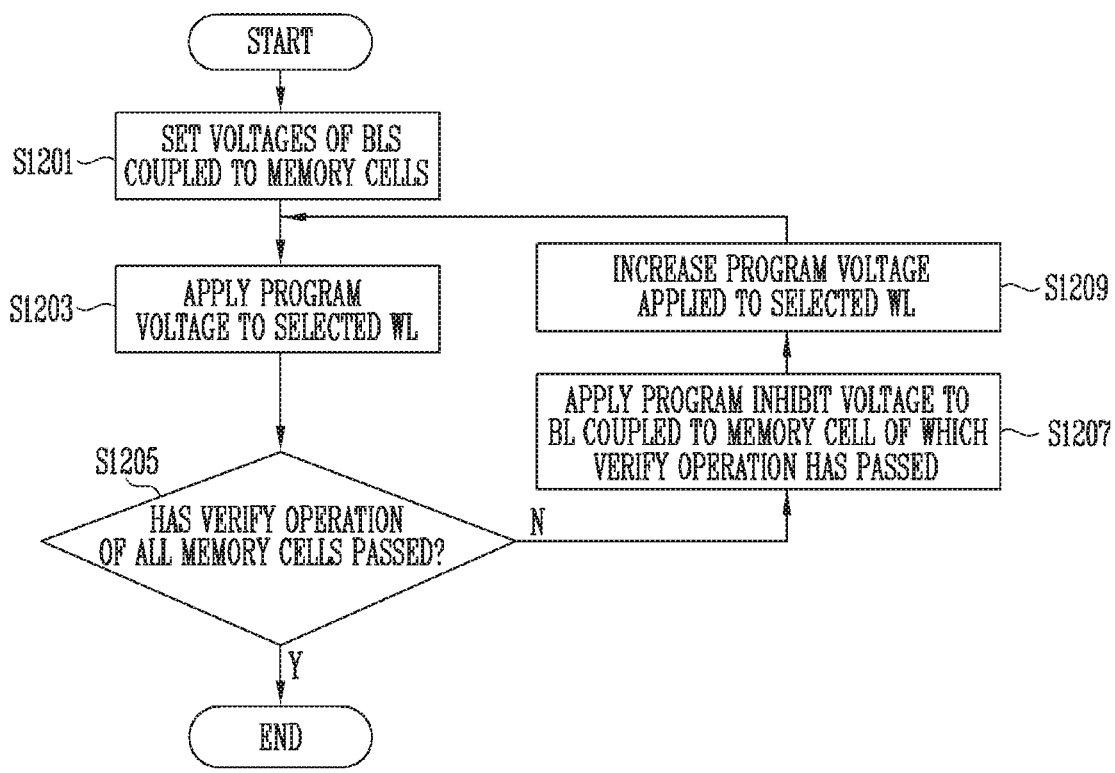
FIG. 12 is a diagram illustrating an operation of the memory device according to an embodiment of the present disclosure.

FIG. 12 is a diagram illustrating an operation of the memory device according to an embodiment of the present disclosure.

Referring to FIG. 12, in step S1201, the memory device may set voltages of bit lines coupled to a plurality of memory cells coupled to a selected word line. The voltage to be applied to the bit line may correspond to any one of a program allowable voltage, a program control voltage or a program inhibit voltage.

In step S1203, the memory device may apply a program voltage to the selected word line. The program voltage allows the plurality of memory cells to be programmed to be in a program state corresponding to the program voltage.

In step S1205, the memory device may perform a verify operation on the memory cells. In the verify operation, the memory device determines whether the plurality of memory cells coupled to the selected word line have threshold voltages corresponding to target program states. When the verify operation of all the memory cells coupled to the selected word line passes, the program operation ends. When there exist memory cells of which verify operation has not passed, operation of the memory device proceeds to step S1207.

In the step S1207, the memory device applies the program inhibit voltage VINH to a bit line coupled to a memory cell of which verify operation has passed. A previously applied bit line voltage may be applied again to the other memory cells.

In step S1209, the memory device may increase the program voltage by a step voltage. The operation then proceeds to step S1203.

Figure 13:
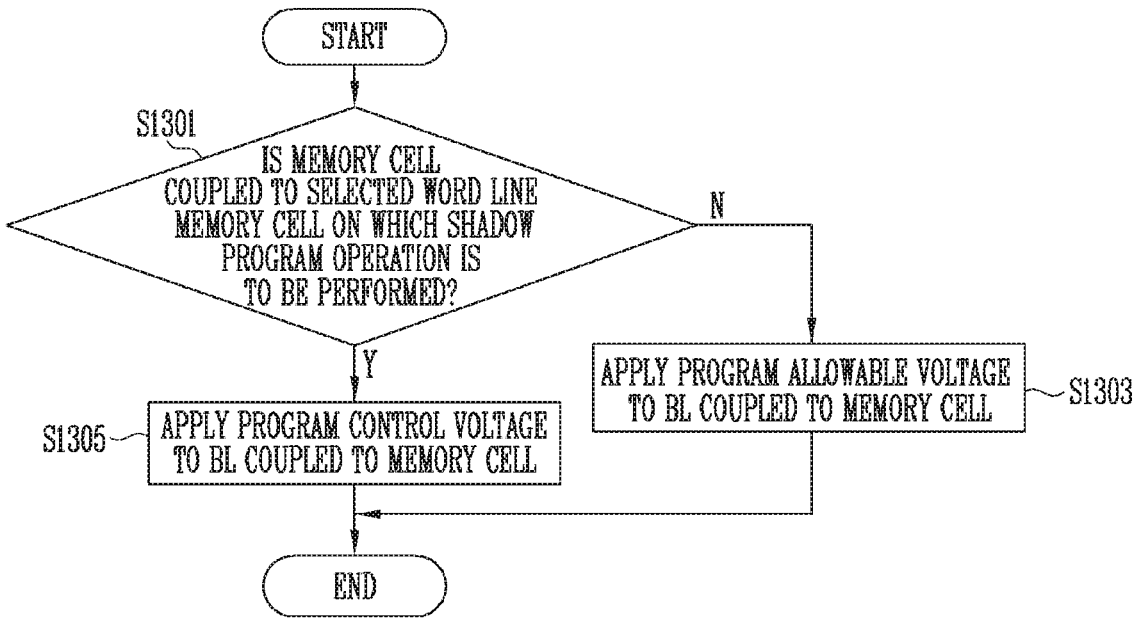
FIG. 13 is a diagram illustrating an operation of the memory device according to an embodiment of the present disclosure.

FIG. 13 is a diagram illustrating an operation of the memory device according to an embodiment of the present disclosure.

FIG. 13 is a diagram illustrating in detail the step S1201 of FIG. 12.

In step S1301, the memory device determines whether a memory cell coupled to the selected word line is a memory cell on which a shadow program operation ("Shadow PGM") is to be performed.

In step S1305, when the memory cell coupled to the selected word line is the memory cell on which the shadow program operation ("Shadow PGM") is to be performed, the memory device applies a program control voltage to a bit line coupled to the memory cell. In an embodiment, the level of each of program control voltages may be determined according to a difference in threshold voltage between a target program state of a memory cell coupled to a corresponding bit line and a program state corresponding to the program voltage applied to the selected word line.

In step S1303, when the memory cell coupled to the selected word line is not the memory cell on which the shadow program operation ("Shadow PGM") is to be performed, the memory device applies a program allowable voltage to the bit line coupled to the memory cell. In an embodiment, the program allowable voltage may be a ground voltage 0V.

A program loop may be performed after bit line voltages are respectively applied to bit lines of all memory cells coupled to the selected word line by performing the steps S1303 and S1305.

Figure 14:
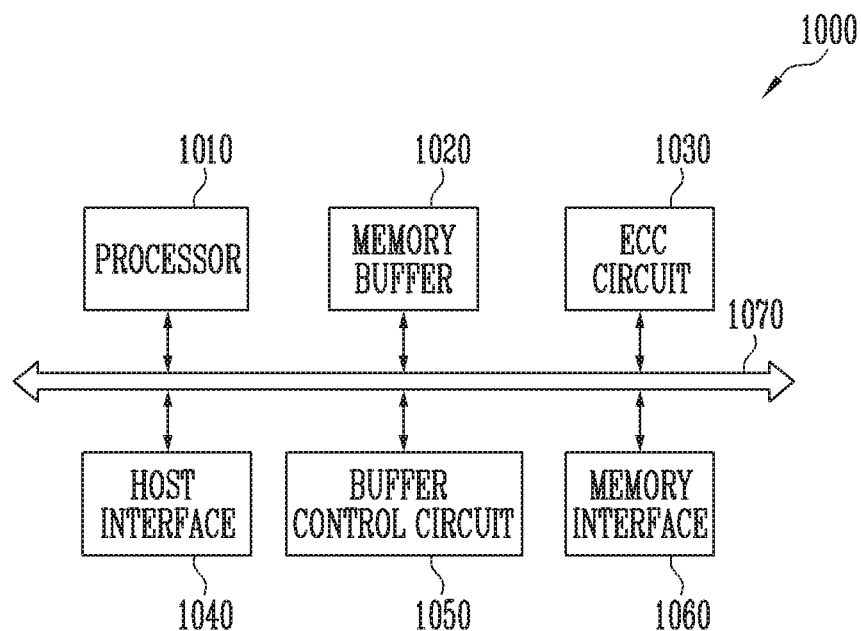
FIG. 14 is a diagram illustrating another embodiment of a memory controller of FIG. 1.

FIG. 14 is a diagram illustrating another embodiment of the memory controller 200 of FIG. 1.

The memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

Referring to FIG. 14, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing using software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host using at least one of various communication protocols such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050, one or both of which may be provided separately, or functions of one or both may be distributed with the memory buffer 1020.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other so as not interfere with or influence each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 15:
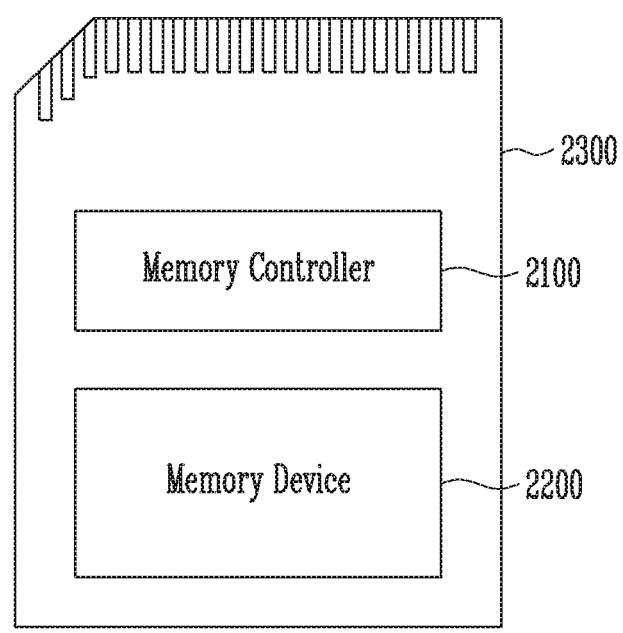
FIG. 15 is a block diagram illustrating a memory card system to which the storage device is applied according to an embodiment of the present disclosure.

FIG. 15 is a block diagram illustrating a memory card system to which the storage device may be applied according to an embodiment of the present disclosure.

Referring to FIG. 15, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory device 2200 may be implemented identically to the memory device 100 described with reference to FIG. 2.

In an example, the memory controller 2100 may include components such as a Random Access Memory (RAM), a processor, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented as any of various nonvolatile memory devices such as an Electrically Erasable and Programmable ROM (EPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device to constitute a memory card such as a PC card (Personal Computer Memory Card International Association (PCM-CIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and/or a Universal Flash Storage (UFS).

Figure 16:
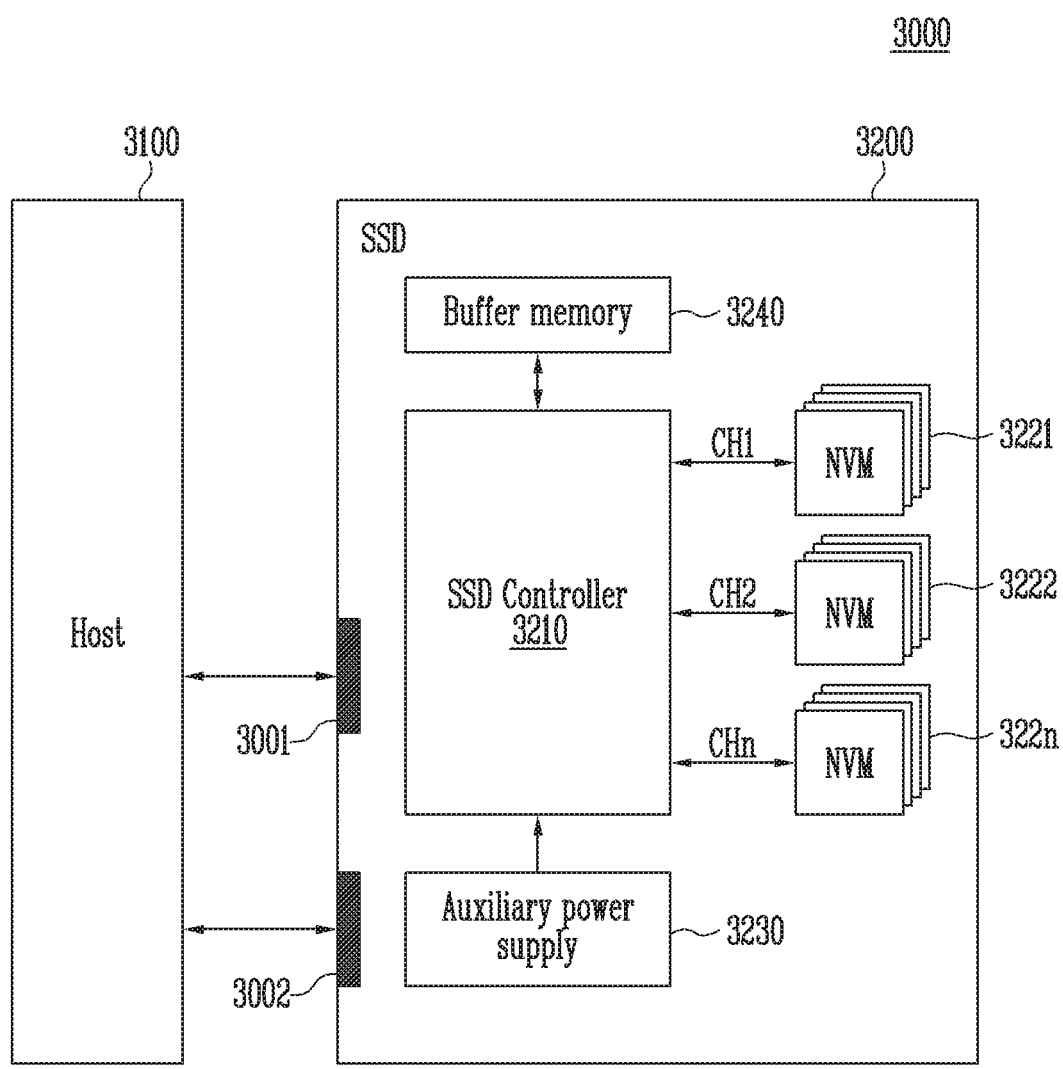
FIG. 16 is a block diagram exemplarily illustrating a Solid State Drive (SSD) system to which the storage device is applied according to an embodiment of the present disclosure.

FIG. 16 is a block diagram exemplarily illustrating a Solid State Drive (SSD) system to which the storage device may be applied according to an embodiment of the present disclosure.

Referring to FIG. 16, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be based on an interface between the host 3100 and the SSD 3200. For example, the signal SIG may be defined by at least one of interfaces such as a Universal Serial Bus (USB), Multi-Media Card (MMC) an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located externally to the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 17:
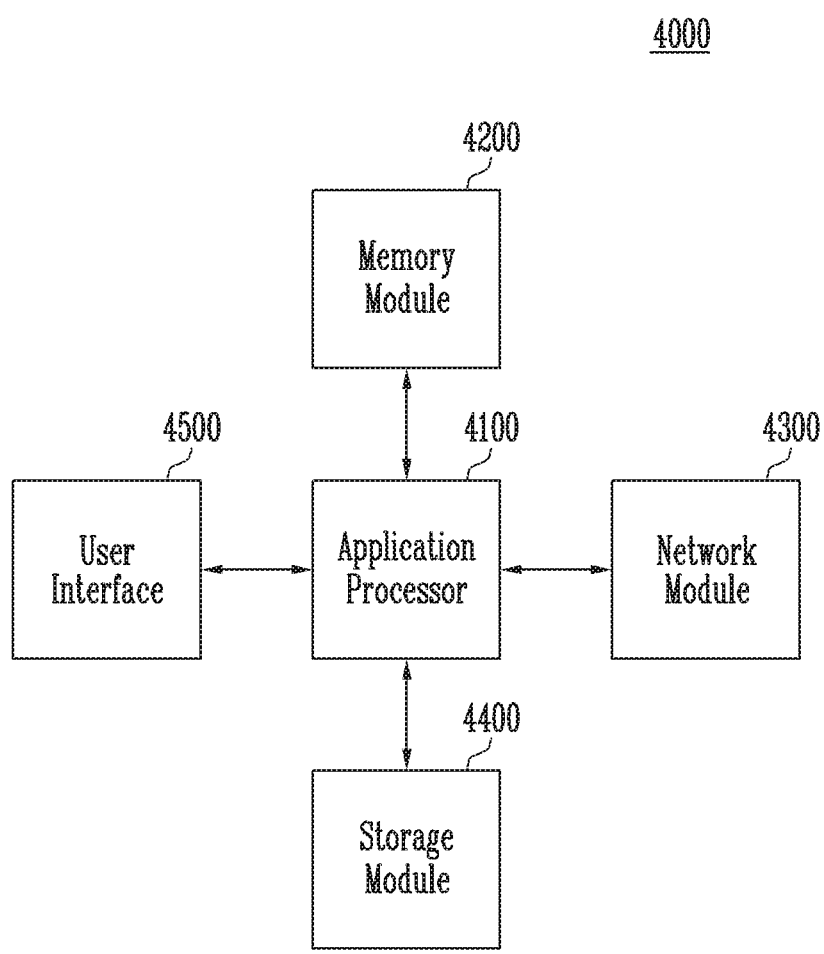
FIG. 17 is a block diagram illustrating a user system to which the storage device is applied according to an embodiment of the present disclosure.

FIG. 17 is a block diagram illustrating a user system to which the storage device may be applied according to an embodiment of the present disclosure.

Referring to FIG. 17, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SDC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or volatile random access memories such as a PRAM, a ReRAM, an MRAM, and a FRAM. In an example, the application processor 4100 and the memory module 4200 may be provided as one semiconductor package by being packaged based on a Package on Package (PDP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device described with reference to FIGS. 2 to 5. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a motor.

According to the present disclosure, a memory device having improved program operation speed and an operating method of the memory device are provided.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
a memory cell array including a plurality of memory cells respectively coupled to a plurality of word lines;
a peripheral circuit configured to perform at least one program loop including applying a program voltage to selected memory cells coupled to a selected word line among the plurality of word lines and determining whether the selected memory cells have been completely programmed; and
control logic configured to control the peripheral circuit to, while the program voltage is being applied to the selected word line, apply program control voltages of different levels, which are set according to target program states, to bit lines respectively coupled to memory cells in a first memory cell group among the selected memory cells and apply a program allowable voltage, which is set at a same level regardless of the target program states, to bit lines respectively coupled to memory cells in a second memory cell group among the selected memory cells.

2. The memory device of claim 1, wherein the selected memory cells have, as a target program state, any one program state among first to nth program states (n is a natural number greater than 1),
wherein the program voltage corresponds to the highest program state among target program states of the memory cells in the first memory cell group.

3. The memory device of claim 1, wherein the control logic controls the peripheral circuit to apply a program inhibit voltage to a bit line coupled to a memory cell determined to have been completely programmed among the selected memory cells.

4. The memory device of claim 1, wherein the memory cells in the first memory cell group have, as a target program state, any one program state among first to kth program states (k is a natural number greater than 1), and
the memory cells in the second memory cell group have, as a target program state, any one program state among (k+1)th to nth program states (n is a natural number greater than (k+1)).

5. The memory device of claim 1, wherein the memory cells in the first memory cell group have, as a target program state, any one program state among pth to qth program states (p is a natural number that is greater than 1 and less than q, and q is a natural number greater than p), and
the memory cells in the second memory cell group have, as a target program state, a program state, except the pth to qth program states, among the first to nth program states (n is a natural number greater than q).

6. The memory device of claim 1, wherein the program voltage is increased by a step voltage whenever the at least one program loop is repeated.

7. The memory device of claim 6, wherein the program control voltage has a high level when the target program state of the memory cells in the first memory cell group is low.

8. The memory device of claim 1, wherein the program control voltages are applied in a first program loop of the at least one program loop while the program voltage is being applied.

9. The memory device of claim 8, wherein, whenever the at least one program loop is repeated, the program voltage is increased by a step voltage.

10. The memory device of claim 8, wherein the control logic controls the peripheral circuit to apply a program inhibit voltage to a bit line coupled to a memory cell determined to have been completely programmed among the memory cells in the first memory cell group.

11. A method for operating a memory device including a plurality of memory cells respectively coupled to a plurality of word lines, the method comprising:
performing at least one program loop including applying a program voltage to selected memory cells coupled to a selected word line among the plurality of word lines and determining whether the selected memory cells have been completely programmed; and
while the program voltage is being applied to the selected word line, applying program control voltages of different levels to bit lines respectively coupled to memory cells in a first memory cell group among the selected memory cells and applying a program allowable voltage to bit lines respectively coupled to memory cells in a second memory cell group among the selected memory cells,
wherein the levels of program control voltages are set according to target program states and the program allowable voltage is set at a same level regardless of the target program states.

12. The method of claim 11, wherein, in the applying of the program voltage, a voltage corresponding to the highest program state among first to nth program states (n is a natural number greater than 1) is applied.

13. The method of claim 11, wherein the applying of the program control voltages comprises applying a program inhibit voltage to a bit line coupled to a memory cell determined to have been completely programmed among the selected memory cells.

14. The method of claim 11, wherein the performing of the at least one program loop includes:
applying a program control voltage such that the memory cells in the first memory cell group have, as a target program state, any one program state among first to kth program states (k is a natural number greater than 1); and
applying a program allowable voltage such that the memory cells in the second memory cell group have, as a target program state, any one program state among (k+1)th to nth program states (n is a natural number greater than (k+1)).

15. The method of claim 11, wherein the performing of the at least one program loop includes:
applying a program control voltage such that the memory cells in the first memory cell group have, as a target program state, any one program state among pth to qth program states (p is a natural number that is greater than 1 and less than q, and q is a natural number greater than p); and
applying a program allowable voltage such that the memory cells included in the second memory cell group have, as a target program state, a program state, except the pth to qth program states, among the first to nth program states (n is a natural number greater than q).

16. The method of claim 11, wherein, in the applying of the program voltage, the program voltage is increased by a step voltage whenever the at least one program loop is repeated.

17. The method of claim 16, wherein the applying of the program control voltages comprises applying a high voltage level when the target program state of the memory cells in the first memory cell group is low.

18. The method of claim 11, wherein the performing of the at least one program loop includes applying the program control voltages in a first program loop of the at least one program loop while the program voltage is being applied.

19. The method of claim 18, wherein, in the applying of the program voltage, the program voltage is increased by a step voltage whenever the at least one program loop is repeated, and the applying of the program allowable voltage comprises applying a program inhibit voltage to a bit line coupled to a memory cell determined to have been completely programmed.

* * * * *